United States Patent
Horiuchi et al.

(10) Patent No.: US 11,811,009 B2
(45) Date of Patent: Nov. 7, 2023

(54) LIGHT EMITTING DEVICE WITH WIRING ENCLOSED BY CERAMIC SUBSTRATE

(71) Applicant: Shinko Electric Industries Co., LTD., Nagano-ken (JP)

(72) Inventors: Michio Horiuchi, Nagano (JP); Yuichiro Shimizu, Nagano (JP); Masaya Tsuno, Matsumoto (JP)

(73) Assignee: Shinko Electric Industries Co., LTD., Nagano-ken (JP)

( * ) Notice: Subject to any disclaimer, the term of this patent is extended or adjusted under 35 U.S.C. 154(b) by 184 days.

(21) Appl. No.: 17/342,841

(22) Filed: Jun. 9, 2021

(65) Prior Publication Data

US 2021/0391518 A1    Dec. 16, 2021

(30) Foreign Application Priority Data

Jun. 11, 2020   (JP) .................................. 2020-101583

(51) Int. Cl.
*H01L 27/15* (2006.01)
*H01L 33/62* (2010.01)
*H01L 33/38* (2010.01)

(52) U.S. Cl.
CPC ............ *H01L 33/62* (2013.01); *H01L 27/156* (2013.01); *H01L 33/382* (2013.01)

(58) Field of Classification Search
CPC ..... H01L 33/62; H01L 27/156; H01L 33/382; H01L 33/385; H01L 33/44; H01L 33/505; H01L 2933/0041; H01L 2933/0066
USPC ....................................................... 257/79
See application file for complete search history.

(56) References Cited

U.S. PATENT DOCUMENTS

| | | | |
|---|---|---|---|
| 2006/0113906 A1 | 6/2006 | Ogawa | |
| 2008/0023713 A1* | 1/2008 | Maeda | H01L 33/486 257/E33.072 |
| 2010/0151604 A1 | 6/2010 | Kal et al. | |
| 2011/0057553 A1 | 3/2011 | Ogawa | |
| 2014/0070263 A1* | 3/2014 | Choi | H01L 33/0075 257/99 |
| 2016/0133809 A1 | 5/2016 | Kuramoto | |

FOREIGN PATENT DOCUMENTS

| | | | | |
|---|---|---|---|---|
| CN | 1534355 A | * | 10/2004 | ........... G02B 6/0073 |
| JP | 2006-156668 A | | 6/2006 | |
| JP | 2010-147463 A | | 7/2010 | |
| JP | 2010-283123 A | | 12/2010 | |
| JP | 2015-133451 A | | 7/2015 | |
| JP | 2016-092276 A | | 5/2016 | |
| WO | WO-2014058641 A2 | * | 4/2014 | ............. H01L 27/15 |
| WO | WO-2018095816 A1 | * | 5/2018 | ......... H01L 33/0075 |

OTHER PUBLICATIONS

Japanese Office Action dated Aug. 14, 2023, in connection with Japanese Application No. 2020-101583.

* cited by examiner

*Primary Examiner* — Tan N Tran
(74) *Attorney, Agent, or Firm* — Wolf, Greenfield & Sacks, P.C.

(57) ABSTRACT

A light emitting device includes a ceramic substrate, a light emitting element, and a wiring. The light emitting element is formed on an upper surface of the ceramic substrate. The wiring is arranged inside the ceramic substrate and is electrically and directly connected to the light emitting element. The light emitting element includes a structure in which a lower semiconductor layer, an active layer, and an upper semiconductor layer are sequentially stacked.

7 Claims, 6 Drawing Sheets

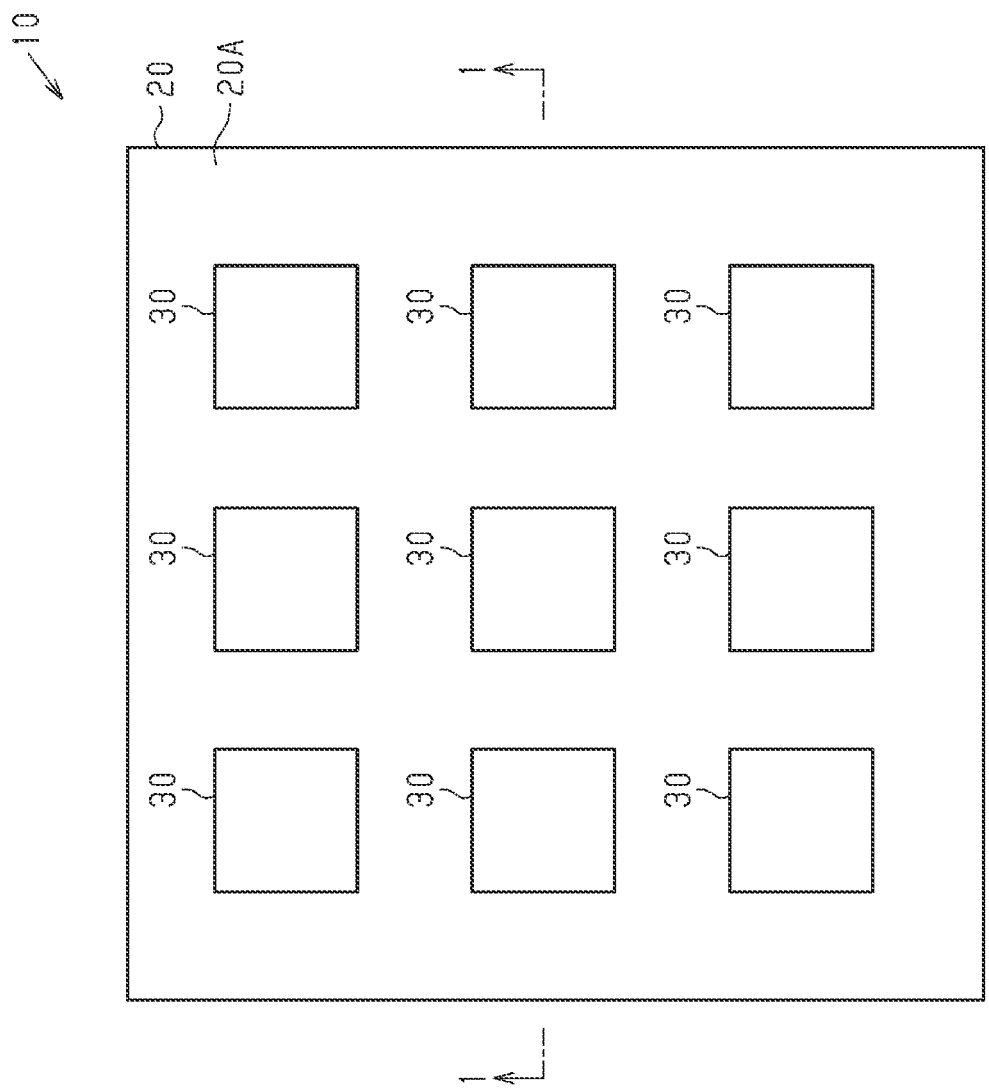

LIGHT EMITTING DEVICE WITH WIRING ENCLOSED BY CERAMIC SUBSTRATE

CROSS-REFERENCE TO RELATED APPLICATIONS

This application is based upon and claims the benefit of priority from prior Japanese Patent Application No. 2020-101583, filed on Jun. 11, 2020, the entire contents of which are incorporated herein by reference.

FIELD

This disclosure relates to a light emitting device.

BACKGROUND

A light emitting device that includes a light emitting element on a substrate may have any of various structures. Japanese Laid-Open Patent Publication No. 2010-147463 discloses a light emitting device that includes a plurality of light emitting elements mounted on a sapphire substrate. Each light emitting element includes a lower semiconductor layer, an upper semiconductor layer arranged on a region of the lower semiconductor layer, and an active layer located between the lower semiconductor layer and the upper semiconductor layer. In this type of light emitting device, an insulating layer is formed on the sapphire substrate to entirely cover the light emitting elements. The insulating layer includes an opening where a wiring layer is formed to electrically connect adjacent light emitting elements.

SUMMARY

There is room for improvement in further reduction in the size of the light emitting device.

A light emitting device in accordance with an embodiment includes a ceramic substrate, a light emitting element, and a wiring. The light emitting element is formed on an upper surface of the ceramic substrate. The wiring is arranged inside the ceramic substrate and is electrically and directly connected to the light emitting element. The light emitting element includes a structure in which a lower semiconductor layer, an active layer, and an upper semiconductor layer are sequentially stacked.

BRIEF DESCRIPTION OF THE DRAWINGS

The embodiment, together with objects and advantages thereof, may best be understood by reference to the following description of the presently preferred embodiment together with the accompanying drawings in which:

FIG. 2 is a schematic plan view of the light emitting device illustrated in FIG. 1;

DESCRIPTION OF THE EMBODIMENTS

Figure 1:
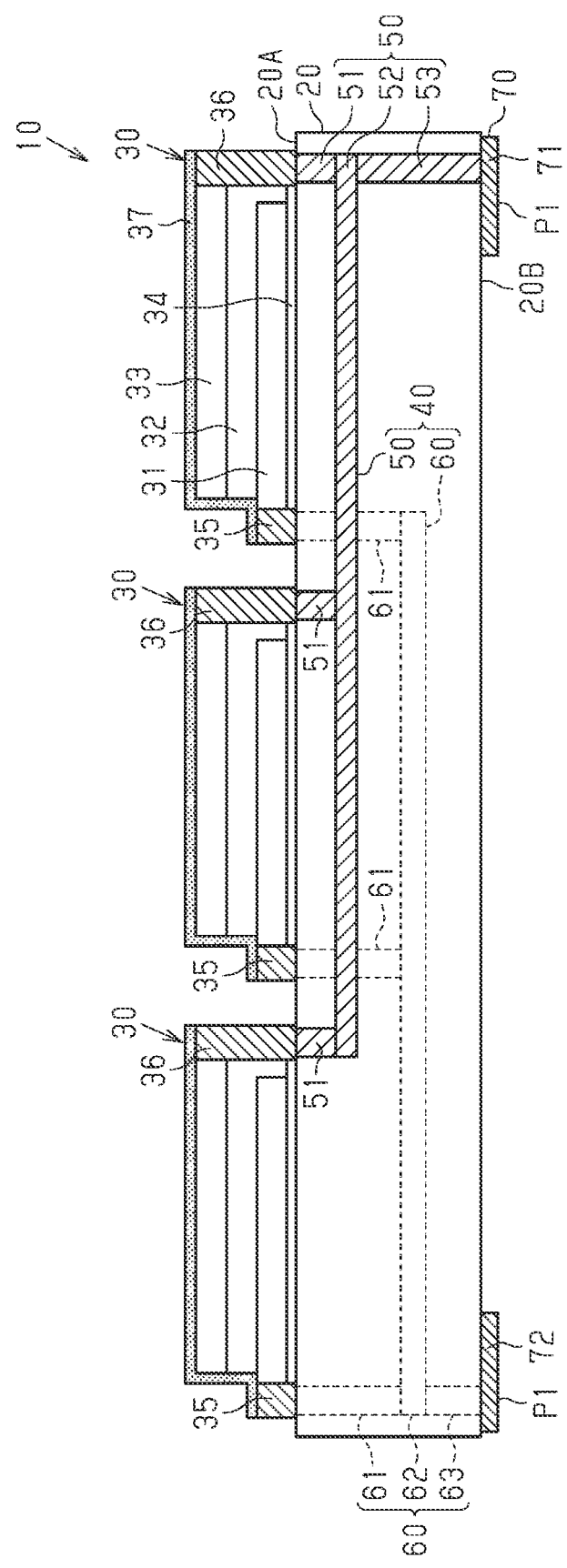
FIG. 1 is a schematic cross-sectional view (taken along line 1-1 in FIG. 2) illustrating a light emitting device of an embodiment.

An embodiment will now be described with reference to the drawings. The drawings may not be to scale, and the relative size, proportions, and depiction of elements in the drawings may be exaggerated for clarity, illustration, and convenience. Moreover, to facilitate understanding, hatching lines may not be illustrated or be replaced by shadings in the cross-sectional drawings. In the present specification, "plan view" refers to a view of a subject taken in a perpendicular direction (for example, vertical direction in FIG. 1). Further, "planar shape" refers to a shape of a subject viewed in the perpendicular direction.

Entire Structure of Light Emitting Device 10

As illustrated in FIG. 1, a light emitting device 10 includes, for example, a ceramic substrate 20 and one or more (nine, in the present embodiment) light emitting elements 30 formed on an upper surface of the ceramic substrate 20. The ceramic substrate 20 includes wirings 40 electrically connected to the light emitting elements 30. Examples of the light emitting element 30 include a light emitting element that is gallium arsenide phosphide (GaAsP) based, gallium phosphide (GaP) based, aluminum gallium arsenide (AlGaAs) based, aluminum gallium indium phosphide (AlGaInP) based, or indium gallium nitride (InGaN) based. Each light emitting element 30 of the present embodiment is an InGaN-based light emitting element that emits light of a blue wavelength.

Structure of Ceramic Substrate 20

The ceramic substrate 20 is a ceramic such as an oxide-based ceramic or a non-oxide-based ceramic. Examples of the oxide-based ceramic include aluminum oxide ($Al_2O_3$, hereafter also "alumina") and zirconia ($ZrO_2$). Examples of the non-oxide-based ceramics include aluminum nitride (AlN) and silicon nitride ($Si_3N_4$). The ceramic substrate 20 is, for example, a monocrystalline ceramic (single crystal) or a polycrystalline ceramic (poly crystal). The monocrystalline ceramic is, for example, monocrystalline alumina (sapphire). The polycrystalline ceramic is, for example, polycrystalline alumina or polycrystalline aluminum nitride.

The ceramic substrate 20 of the present embodiment is an alumina substrate that includes alumina as a main component. The alumina in the present embodiment has a polycrystalline body, or is polycrystalline alumina. In the present specification, the phrase "include alumina as a main component" means that the amount of alumina is the greatest in the material of the alumina substrate. The purity of alumina is, for example, 90% or greater, preferably 95% or greater, and further preferably 99.5% or greater.

The ceramic substrate 20 may use the raw material composition in which, for example, an yttrium oxide and an oxide of a lanthanoid element are added to and mixed in the main component of alumina. The ceramic substrate 20 has, for example, a garnet phase. The garnet phase is, for example, a phase of yttrium aluminum garnet (YAG, $Y_3Al_5O_{12}$). The yttrium aluminum garnet phase is doped with an oxide of a lanthanoid element. The garnet phase including an oxide of a lanthanoid element functions as a fluorescence substance. The lanthanoid element may be, for example, one or more elements selected from a group consisting of cerium (Ce), europium (Eu), erbium (Er), ytterbium (Yb), thulium (Tm), and neodymium (Nd). If the purpose of the light emitting device 10 is to emit white light when the light emitting element 30 emits light of a blue wavelength, cerium may be used as a lanthanoid element. The yttrium aluminum garnet phase including cerium acts as a yellow fluorescence substance that emits yellow fluorescent light. The yellow fluorescence substance absorbs part of the blue light emitted from the light emitting element 30 and emits a yellow fluorescent light. Accordingly, simulated white color is produced by mixed-wavelength light of the yellow light and the blue light that was not absorbed by the yellow fluorescence substance. Further, when the yttrium aluminum garnet phase is further doped with europium as an oxide of a lanthanoid element in addition to cerium, fluorescent light is obtained in the red wavelength region. This improves color rendering properties of the white light. The amount of fluorescence substance formed by the garnet phase may be adjusted so that, for example, the mixed-wavelength state suitable for the luminescence intensity or the wavelength region of the light emitting element 30 is achieved. In this manner, the ceramic substrate 20, which includes a fluorescence substance, has a wavelength conversion functionality.

The content of the garnet phase may be set to, for example, 3 mol % or greater and 50 mol % or less. The content of the yttrium aluminum garnet phase may be set to, for example, 3 mol % or greater and 10 mol % or less. The content of the lanthanoid element may be set to, for example, 0.2 mol % or greater and 10 mol % or less in terms of an oxide. The content of cerium may be set to, for example, 0.2 mol % or greater and 1 mol % or less in terms of an oxide.

The ceramic substrate 20 is, for example, light-transmissive. For example, silicon (Si) may be added as an impurity to the raw material composition of the ceramic substrate 20. This improves the optical characteristics of the ceramic substrate 20. The light-transmissivity of the ceramic substrate 20 may be improved by, for example, adding a subtle amount of a silicon oxide such as silicon dioxide ($SiO_2$) as an impurity. The content of silicon may be set to, for example, 0.001 mol % or greater and 1.0 mol % or less.

The ceramic substrate 20 is, for example, plate-shaped. The ceramic substrate 20 includes an upper surface 20A and a lower surface 20B. The light emitting elements 30 are mounted on the upper surface 20A of the ceramic substrate 20. The light emitting elements 30 are, for example, spaced apart from one another on the upper surface 20A of the ceramic substrate 20.

Structure of Light Emitting Element 30

As illustrated in FIG. 2, the light emitting elements 30 are, for example, arranged in a matrix (3×3 in the present embodiment) on the upper surface 20A of the ceramic substrate 20.

The light emitting element 30 may have any planar shape. The planar shape of the light emitting element 30 may be rectangular or circular. The light emitting element 30 of the present embodiment has a rectangular planar shape.

As illustrated in FIG. 1, each light emitting element 30 has a structure in which a lower semiconductor layer 31, an active layer 32, and an upper semiconductor layer 33 are sequentially stacked. The light emitting element 30 includes, for example, a buffer layer 34, an electrode 35, an electrode 36, and an insulation film 37. The buffer layer 34 is formed on the upper surface 20A of the ceramic substrate 20. The electrode 35 is connected to the lower semiconductor layer 31. The electrode 36 is connected to the upper semiconductor layer 33. The insulation film 37 covers the upper surface of the upper semiconductor layer 33.

One of the lower semiconductor layer 31 and the upper semiconductor layer 33 is a semiconductor layer of an n-type, and the other one of the lower semiconductor layer 31 and the upper semiconductor layer 33 is a semiconductor layer of a p-type. In the present embodiment, the lower semiconductor layer 31 is an n-type semiconductor layer, and the upper semiconductor layer 33 is a p-type semiconductor layer. The lower semiconductor layer 31, the active layer 32, and the upper semiconductor layer 33 are each formed by a gallium nitride (GaN)-based semiconductor substance. The composition elements and the composition ratio of the active layer 32 are determined to emit light of a desired wavelength, for example, ultraviolet light or blue light. The active layer 32 is, for example, a semiconductor layer that includes indium gallium nitride (InGaN) as a main component. The lower semiconductor layer 31 and the upper semiconductor layer 33 are formed by a substance that has a greater band gap than the active layer 32. The lower semiconductor layer 31 and the upper semiconductor layer 33 are, for example, semiconductor layers that include gallium nitride as a main component. The lower semiconductor layer 31, which is an n-type semiconductor layer, may be doped with silicon (Si) that serves as an impurity. Further, the upper semiconductor layer 33, which is a p-type semiconductor layer, may be doped with magnesium (Mg) that serves as an impurity.

The lower semiconductor layer 31 and the upper semiconductor layer 33 may have a single layer structure as illustrated in FIG. 1 or a multilayer structure. Further, the active layer 32 may have a single quantum well structure or a multiple quantum well structure.

The buffer layer 34 is arranged to reduce lattice mismatch between the ceramic substrate 20 and the lower semiconductor layer 31. The buffer layer 34 is disposed between the ceramic substrate 20 and the lower semiconductor layer 31. The buffer layer 34 is disposed, for example, between the ceramic substrate 20 and the active layer 32. The material of the buffer layer 34 may be, for example, aluminum nitride (AlN), aluminum gallium nitride (AlGaN), or gallium nitride. Further, the material of the buffer layer 34 may be, for example, BGaN in which gallium nitride is doped with a small amount of boron (B).

The buffer layer 34 may have any planar shape. The planar shape of the buffer layer 34 may be, for example, rectangular or circular. The buffer layer 34 of the present embodiment has a rectangular planar shape.

The lower semiconductor layer 31 is, for example, formed on the upper surface of the buffer layer 34. The lower semiconductor layer 31 is, for example, formed to cover part of the upper surface of the buffer layer 34. In other words, the lower semiconductor layer 31 is formed on the upper surface of the buffer layer 34 so that part of the upper surface of the buffer layer 34 is exposed to the outside.

The lower semiconductor layer 31 may have any planar shape. The planar shape of the lower semiconductor layer 31 may be, for example, rectangular or circular. The lower semiconductor layer 31 of the present embodiment has a rectangular planar shape. The planar shape of the lower semiconductor layer 31 is, for example, smaller than the planar shape of the buffer layer 34.

The active layer 32 is formed on the upper surface of the lower semiconductor layer 31. The active layer 32 is, for example, formed to cover part of the upper surface of the lower semiconductor layer 31. In other words, the active layer 32 is formed on the upper surface of the lower semiconductor layer 31 so that part of the upper surface of the lower semiconductor layer 31 is exposed to the outside. The active layer 32 is, for example, formed to cover the side surface of part of the lower semiconductor layer 31. The active layer 32 is formed, for example, to cover the upper surface of the buffer layer 34 that is exposed from the lower semiconductor layer 31.

The active layer 32 may have any planar shape. The planar shape of the active layer 32 may be rectangular or circular. The active layer 32 of the present embodiment has a rectangular planar shape. The active layer 32 is smaller in planar shape than the buffer layer 34. The active layer 32 in planar shape has, for example, the same size as the lower semiconductor layer 31 or is greater in size than the lower semiconductor layer 31.

The upper semiconductor layer 33 is formed on the upper surface of the active layer 32. The upper semiconductor layer 33 covers, for example, the entire upper surface of the active layer 32. The upper semiconductor layer 33 exposes, for example, the side surface of the active layer 32.

The upper semiconductor layer 33 may have any planar shape. The planar shape of the upper semiconductor layer 33 may be, for example, rectangular or circular. The upper semiconductor layer 33 of the present embodiment has a rectangular planar shape. The upper semiconductor layer 33 in planar shape has, for example, the same size as the active layer 32.

The electrode 35 is formed on the upper surface 20A of the ceramic substrate 20. The electrode 35 is, for example, post-shaped and extends upward from the upper surface 20A of the ceramic substrate 20. The electrode 35 is connected to, for example, the side surface of the lower semiconductor layer 31. The electrode 35 is connected to, for example, the side surface of the lower semiconductor layer 31 that is exposed from the active layer 32. Thus, the electrode 35 is electrically connected to the lower semiconductor layer 31.

The electrode 35 covers, for example, part of the side surface of the buffer layer 34. The upper surface of the electrode 35 is, for example, flush with the upper surface of the lower semiconductor layer 31.

The electrode 36 is formed on the upper surface 20A of the ceramic substrate 20. The electrode 36 is, for example, post-shaped and extends upward from the upper surface 20A of the ceramic substrate 20. The electrode 36 is arranged, for example, at the side of the active layer 32 and the like opposite to the electrode 35. The electrode 36 is connected to, for example, the side surface of the upper semiconductor layer 33. Thus, the electrode 36 is electrically connected to the upper semiconductor layer 33.

The electrode 36 covers, for example, part of the side surface of the buffer layer 34. The electrode 36 covers, for example, part of the side surface of the active layer 32. The upper surface of the electrode 36 is, for example, flush with the upper surface of the upper semiconductor layer 33.

The material of the electrodes 35 and 36 may be, for example, a metal material such as copper (Cu), a copper alloy, aluminum (Al), or an aluminum alloy. The electrodes 35 and 36 may be, for example, transparent electrodes. In this case, the electrodes 35 and 36 may be formed from, for example, a transparent metal or a metal oxide such as indium tin oxide (ITO). The electrodes 35 and 36 formed from a transparent metal may include, for example, a metal or an alloy of a metal selected from a group consisting of gold (Au), nickel (Ni), platinum (Pt), aluminum (Al), chromium (Cr), and titanium (Ti).

The insulation film 37 covers, for example, the upper surface of the upper semiconductor layer 33 and the upper surface of the electrode 36. The insulation film 37 covers, for example, the side surface of the upper semiconductor layer 33, which is exposed from the electrodes 35 and 36, and the side surface of the active layer 32, which is exposed from the electrodes 35 and 36. The insulation film 37 covers, for example, the upper surface of the lower semiconductor layer 31 that is exposed from the active layer 32 and the upper semiconductor layer 33. The insulation film 37 covers, for example, the upper surface of the electrode 35. The insulation film 37 continuously covers, for example, the upper surface of the electrode 36, the upper surface of the upper semiconductor layer 33, the side surface of the upper semiconductor layer 33, the side surface of the active layer 32, the upper surface of the lower semiconductor layer 31, and the upper surface of the electrode 35.

The insulation film 37 may use, for example, a silicon oxide ($SiO_2$) film or a silicon nitride ($Si_3N_4$) film.

The light emitting device 10 includes, for example, the wirings 40 and electrode terminals 70. The wirings 40 are arranged inside the ceramic substrate 20. The electrode terminals 70 are formed on the lower surface 20B of the ceramic substrate 20. The wirings 40 are arranged inside the ceramic substrate 20 that serves as a base material for forming the light emitting element 30. The material of the wirings 40 and the electrode terminals 70 may be, for example, a high melting point metal. The material of the wirings 40 and the electrode terminals 70 may be, for example, a metal material that includes at least one metal selected from a group consisting of tungsten (W), molybdenum (Mo), platinum (Pt), and palladium (Pd) as a main component. For example, the wirings 40 and the electrode terminals 70 include 90 wt % of tungsten or molybdenum. The wirings 40 and the electrode terminals 70 may be formed from the same material or from different materials.

Structure of Wirings 40

The wirings 40 are electrically connected to the light emitting elements 30. The wirings 40 electrically connect, for example, the light emitting elements 30 to one another. For example, the wirings 40 connect the light emitting elements 30 in parallel or in series. In another example, the wirings 40 connect the light emitting elements 30 in parallel and in series. In the present embodiment, the wirings 40 connect the light emitting elements 30 in parallel.

The wirings 40 electrically connect, for example, the light emitting elements 30 and the electrode terminals 70, which are formed on the lower surface 20B of the ceramic substrate 20. The electrode terminals 70 each include, for example, an external connection pad P1 to which an external connection terminal (not illustrated) is connected. The electrode terminal 70 is supplied with power from, for example, an external power supply via the external connection terminal (not illustrated) and the like. The external connection terminal may be, for example, a solder bump, a solder ball, a lead pin, or the like. The electrode terminals 70 include an electrode terminal 71 and an electrode terminal 72. For example, one of the electrode terminals 71 and 72 is a positive electrode terminal, and the other one of the electrode terminals 71 and 72 is a negative electrode terminal.

The wirings 40 of the present embodiment include wiring 50 and wiring 60. The wiring 50 is electrically connected to the electrode terminal 71, and the wiring 60 is electrically connected to the electrode terminal 72. The wiring 50 electrically connects, for example, the electrode 36 of each light emitting element 30 and the electrode terminal 71. The wiring 60 electrically connects, for example, the electrode 35 of each light emitting element 30 and the electrode terminal 72.

Structure of Wiring 50

The wiring 50 includes, for example, wiring layers 51, a wiring layer 52, and a wiring layer 53. The wiring layer 52 is electrically connected to the wiring layers 51. The wiring layer 53 is electrically connected to the wiring layer 52.

The wiring layers 51 are respectively connected to the electrodes 36 of the light emitting elements 30. The upper surfaces of the wiring layers 51 are exposed from the upper surface 20A of the ceramic substrate 20. The upper surfaces of the wiring layers 51 are flush with the upper surface 20A of the ceramic substrate 20. The upper surfaces of the wiring layers 51 are directly connected to the respective lower surfaces of the electrodes 36. In this manner, the wiring layers 51 are electrically connected to the electrodes 36. In the present specification, the term "directly connect" or "directly connected" refers to the electrical connection of two components without any other intervening component, such as solder or the like. Each wiring layer 51 is post-shaped and extends downward from the upper surface 20A of the ceramic substrate 20. The lower surfaces of the wiring layers 51 are connected to the upper surface of the wiring layer 52. The side surfaces of the wiring layers 51 are covered by the ceramic substrate 20.

The wiring layer 52 extends in a planar direction of the ceramic substrate 20 (or in a direction orthogonal to a thickness-wise direction of the ceramic substrate 20 in a cross-sectional view). The wiring layer 52 is connected to, for example, every one of the wiring layers 51. In the present embodiment, the nine wiring layers 51, which are connected to the electrodes 36 of the nine light emitting elements 30, are connected to the same wiring layer 52. The wiring layer 52 is embedded inside the ceramic substrate 20. The upper surface, the lower surface, and the side surfaces of the wiring layer 52 are covered by the ceramic substrate 20.

The wiring layer 53 electrically connects the wiring layer 52 and the electrode terminal 71. The upper surface of the wiring layer 53 is connected to the lower surface of the wiring layer 52. The wiring layer 53 is post-shaped and extends downward from the lower surface of the wiring layer 52. The lower surface of the wiring layer 53 is connected to the electrode terminal 71. The lower surface of the wiring layer 53 is exposed from the lower surface 20B of the ceramic substrate 20. The lower surface of the wiring layer 53 is flush with the lower surface 20B of the ceramic substrate 20. The lower surface of the wiring layer 53 is directly connected to the upper surface of the electrode terminal 71. The side surface of the wiring layer 53 is covered by the ceramic substrate 20.

Structure of Wiring 60

The wiring 60 includes, for example, wiring layers 61, a wiring layer 62, and a wiring layer 63. The wiring layer 62 is electrically connected to the wiring layers 61. The wiring layer 63 is electrically connected to the wiring layer 62.

The wiring layers 61 are respectively connected to the electrodes 35 of the light emitting elements 30. The upper surfaces of the wiring layers 61 are exposed from the upper surface 20A of the ceramic substrate 20. The upper surfaces of the wiring layers 61 are flush with the upper surface 20A of the ceramic substrate 20. The upper surfaces of the wiring layers 61 are directly connected to the respective lower surfaces of the electrodes 35. In this manner, the wiring layers 61 are electrically connected to the electrodes 35. Each wiring layer 61 is post-shaped and extends downward from the upper surface 20A of the ceramic substrate 20. The wiring layer 61 has, for example, a greater thickness than the wiring layer 51. The lower surfaces of the wiring layers 61 are connected to the upper surface of the wiring layer 62. The side surfaces of the wiring layers 61 are covered by the ceramic substrate 20.

The wiring layer 62 extends in the planar direction of the ceramic substrate 20. The wiring layer 62 is connected to, for example, every one of the wiring layers 61. In the present embodiment, the nine wiring layers 61, which are connected to the electrodes 35 of the nine light emitting elements 30, are connected to the same wiring layer 62. The wiring layer 62 is embedded inside the ceramic substrate 20. The upper surface, the lower surface, and the side surfaces of the wiring layer 62 are covered by the ceramic substrate 20. The wiring layer 62 is formed, for example, on a plane differing from the wiring layer 52. The wiring layer 62 is formed, for example, on a plane located downward from the wiring layer 52.

The wiring layer 63 electrically connects the wiring layer 62 and the electrode terminal 72. The upper surface of the wiring layer 63 is connected to the lower surface of the wiring layer 62. The wiring layer 63 is post-shaped and extends downward from the lower surface of the wiring layer 62. The lower surface of the wiring layer 63 is connected to the electrode terminal 72. The lower surface of the wiring layer 63 is exposed from the lower surface 20B of the ceramic substrate 20. The lower surface of the wiring layer 63 is flush with the lower surface 20B of the ceramic substrate 20. The lower surface of the wiring layer 63 is directly connected to the upper surface of the electrode terminal 72. The side surface of the wiring layer 63 is covered by the ceramic substrate 20.

As described above, the electrodes 36 of the light emitting elements 30 are electrically connected to the electrode terminal 71 by the wiring layers 51 to 53 (i.e., wiring 50), and the electrodes 35 of the light emitting elements 30 are electrically connected to the electrode terminal 72 by the wiring layers 61 to 63 (i.e., wiring 60). Thus, the light emitting elements 30 are connected by the wiring 50 and 60 in parallel. In other words, the light emitting elements 30 are electrically connected to one another by the wiring 50 and 60 that are arranged inside the ceramic substrate 20, which serves as a base material for forming the light emitting elements 30. The light emitting elements 30 are also electrically connected to the electrode terminals 70 by the wiring 50 and 60. Further, the light emitting elements 30 are supplied with power via the electrode terminal 70 and the wiring 50 and 60 from an external power supply (not illustrated) to emit light.

Manufacturing Method of Light Emitting Device 10

A method for manufacturing the light emitting device 10 will now be described with reference to FIGS. 3A to 4B.

Figure 3A:
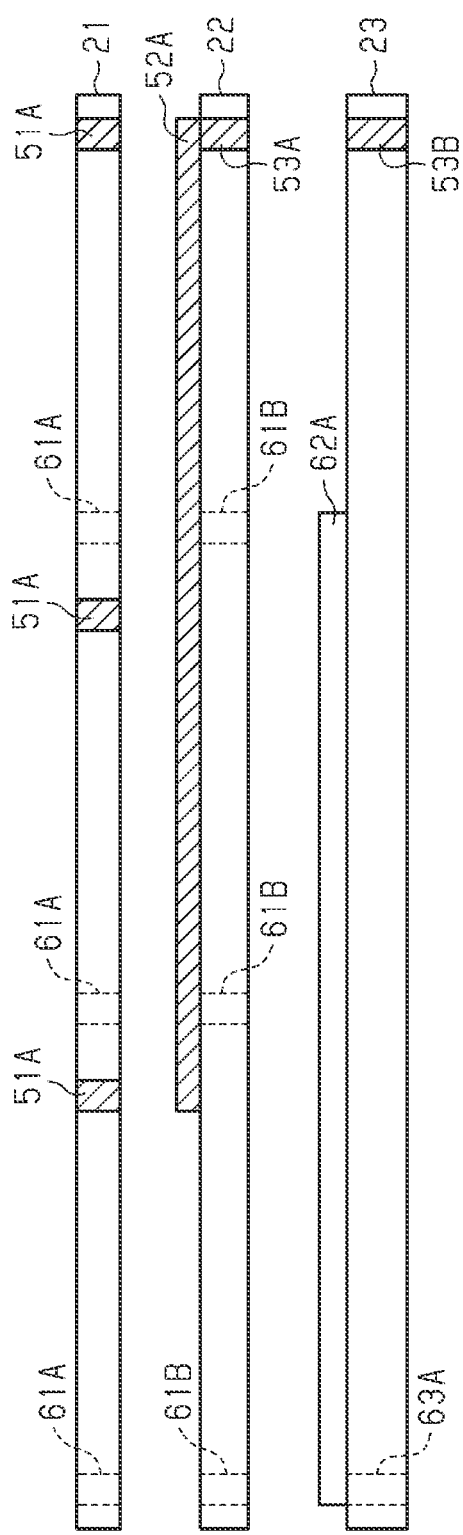
FIGS. 3A, 3B, 4A, and 4B are schematic cross-sectional views illustrating a method for manufacturing the light emitting device illustrated in FIG. 1.

First, in a step illustrated in FIG. 3A, multiple (three in the present case) green sheets 21, 22, and 23 are prepared by dispersing and mixing a binder, a plasticizer, and an organic solvent in a ceramic powder. Through holes are formed in the green sheets 21, 22, and 23 where the wiring layers 51, 53, 61, and 63 are formed. The ceramic powder of the green sheets 21, 22, and 23 may be, for example, obtained by adding and mixing an yttrium oxide and an oxide of a lanthanoid element to the main component of alumina.

Metal layers 51A and 61A are formed in the through holes of the green sheet 21. The metal layers 51A and 61A are fired in a subsequent step to form the wiring layers 51 and 61 illustrated in FIG. 1.

A metal layer 52A is formed on the upper surface of the green sheet 22. Further, metal layers 53A and 61B are formed in the through holes of the green sheet 22. The metal layer 52A is fired in a subsequent step to form the wiring layer 52 illustrated in FIG. 1. Further, the metal layers 53A and 61B are fired in a subsequent step to form the wiring layers 53 and 61 illustrated in FIG. 1.

A metal layer 62A is formed on the upper surface of the green sheet 23. Further, metal layers 53B and 63B are formed in the through holes of the green sheet 23. The metal layer 62A are fired in a subsequent step to form the wiring layer 62 illustrated in FIG. 1. Further, the metal layers 53B and 63A are fired in a subsequent step to form the wiring layers 53 and 63 illustrated in FIG. 1.

The metal layers 51A, 52A, 53A, 53B, 61A, 61B, 62A, and 63A may be formed, for example, by performing a printing process. For example, the metal layers 51A, 52A, 53A, 53B, 61A, 61B, 62A, and 63A may be formed by performing screen printing using a metal paste. The metal paste may use, for example, a high melting point metal as the main component. The metal paste may be, for example, a mixture of nickel oxide, aluminum oxide, silicon dioxide, and an organic material in which the main component is tungsten or molybdenum.

Figure 3B:
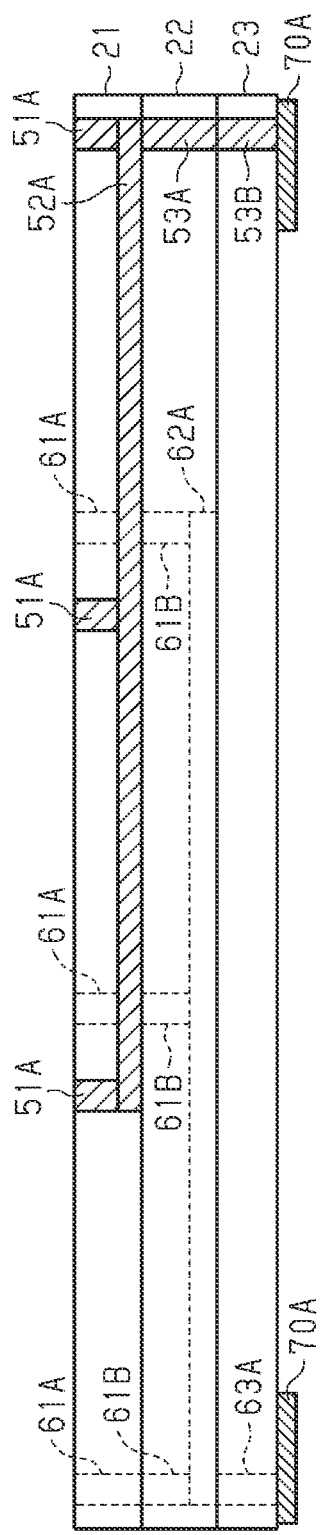

In a step illustrated in FIG. 3B, the green sheets 21, 22, and 23 prepared in the step illustrated in FIG. 3A are stacked sequentially to produce a stacked body.

Subsequently, a metal layer 70A is formed on the lower surface of the green sheet 23 that is fired to form the electrode terminal 70. The metal layer 70A may be formed, for example, by performing a printing process. For example, the metal layer 70A may be formed by performing screen printing process using a metal paste. The metal paste may be, for example, the same material as the metal paste forming the metal layers 51A, 52A, 53A, 53B, 61A, 61B, 62A, and 63A. The metal layer 70A may be formed in the step illustrated in FIG. 3A.

Figure 4A:
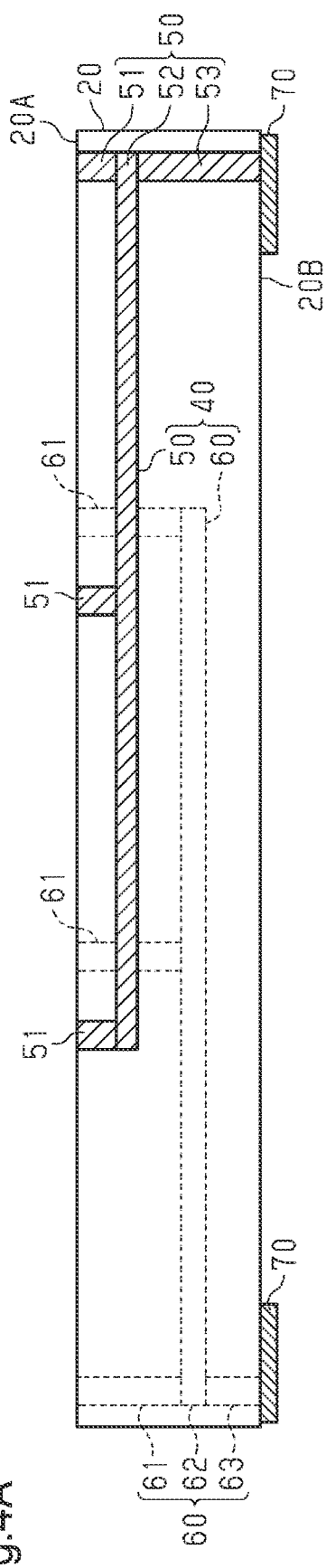

In a step illustrated in FIG. 4A, the stacked body illustrated in FIG. 3B is fired to integrate the green sheets 21, 22, and 23 with one another and form the ceramic substrate 20. The ceramic substrate 20 incorporates the wiring layers 51, 52, 53, 61, 62, and 63, which are obtained by sintering the metal layers 51A, 52A, 53A, 53B, 61A, 61B, 62A, and 63A illustrated in FIG. 3B. Further, the electrode terminal 70, which is obtained by sintering the metal layer 70A, is formed on the lower surface 20B of the ceramic substrate 20. In this manner, various processes are performed on the ceramic substrate 20. For example, the upper surface 20A of the ceramic substrate 20 is ground and polished. In this case, when the wiring layers 51 and 61, the electrode terminal 70, and the like are polished, sputtering or vapor-deposition may be performed to form a new metal layer on the metal surface exposed from the ceramic substrate 20.

The firing step may be performed in, for example, a reducing atmosphere or an air atmosphere. For example, when the ceramic substrate 20 is a ceramic that includes an yttrium aluminum garnet-alumina layer containing cerium, it is preferred that firing be performed in a reducing atmosphere. The present inventors have confirmed that the sintered body of the ceramic substrate 20 has a higher fluorescence intensity when firing is performed in a reducing atmosphere than when firing is performed in an air atmosphere. This is likely caused by the difference in cerium valence balance ($Ce^{+3}/Ce^{+4}$). Accordingly, the fluorescence intensity of the ceramic substrate 20, which is a sintered body, may be adjusted by adjusting the balance between oxidation and reduction, for example, the balance between the level of oxygen and the level of hydrogen, in the firing atmosphere. The temperature for firing is, for example, approximately 1500° C. to 1600° C.

Figure 4B:
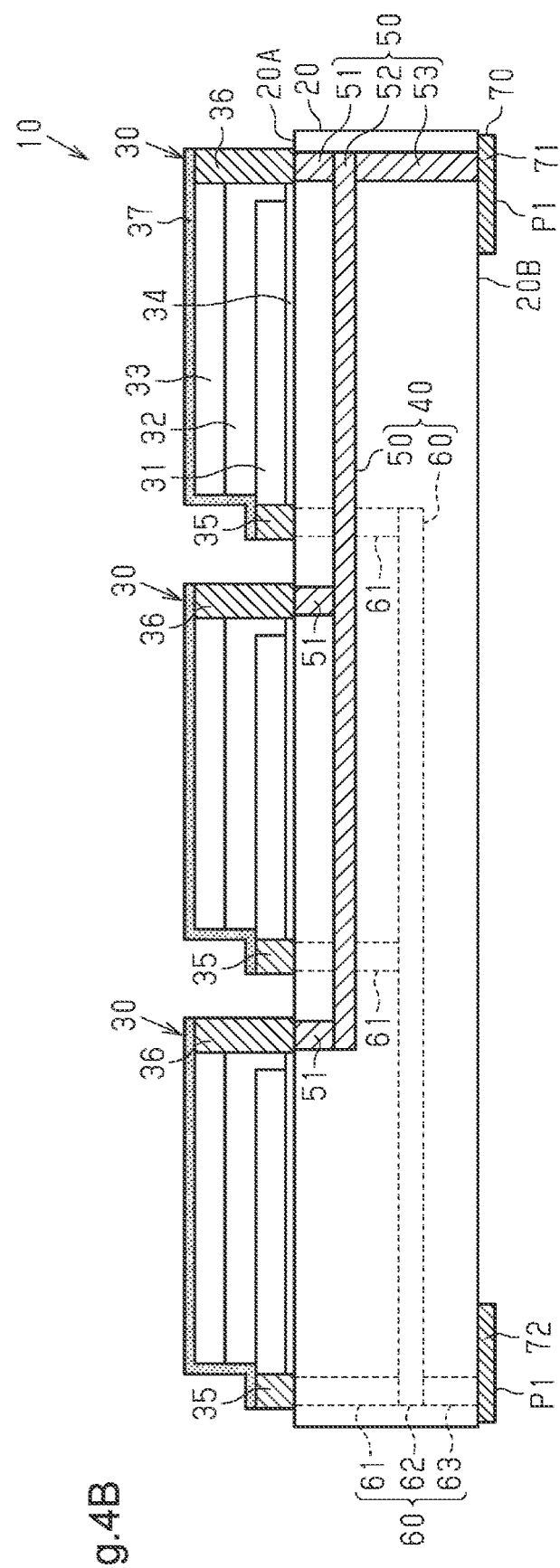

In a step illustrated in FIG. 4B, the light emitting elements 30 are formed on the upper surface 20A of the ceramic substrate 20. For example, the buffer layer 34, the lower semiconductor layer 31, the active layer 32, and the upper semiconductor layer 33 are stacked sequentially on the upper surface 20A of the ceramic substrate 20. The lower semiconductor layer 31, the active layer 32, and the upper semiconductor layer 33 may be formed by performing, for example, metal organic chemical vapor deposition (MOCVD), molecular beam epitaxy (MBE), hydride vapor phase epitaxy (HVPE), or the like. Further, the electrodes 35 and 36 are formed on the upper surface 20A of the ceramic substrate 20. The electrodes 35 and 36 may be formed by performing, for example, plating, electron beam evaporation, chemical vapor deposition (CVD), or the like. Subsequently, the insulation film 37 is formed to continuously cover the upper surface of the electrode 36, the upper surface of the upper semiconductor layer 33, the side surface of the upper semiconductor layer 33, the side surface of the active layer 32, the upper surface of the lower semiconductor layer 31, and the upper surface of the electrode 35.

The light emitting device 10 illustrated in FIG. 1 is manufactured through the processes described above. The light emitting device 10 may be used in a flipped state or arranged at any angle.

The present embodiment has the following advantages.

(1) The ceramic substrate 20 serves as the base material for forming the light emitting element 30 and includes the wirings 40 electrically and directly connected to the light emitting elements 30. This reduces the entire size of the light emitting device 10 compared with when the wirings 40 are arranged outside the ceramic substrate 20, for example, on the upper surface of the insulation film 37.

(2) Further, the wirings 40 are incorporated in the ceramic substrate 20, which is the base material. This allows for direct electric connection between the wirings 40 and the light emitting elements 30 formed on the ceramic substrate 20. Further, the wirings 40 supply the light emitting elements 30 with power from the ceramic substrate 20. The light emitting elements 30 are not removed from the ceramic substrate 20 and mounted on a mounting board other than the ceramic substrate 20 through wire-bonding, flip-chip mounting, or the like. Thus, a mounting board other than the ceramic substrate 20 is not prepared, and the manufacturing cost is reduced. Further, there is no step of mounting the light emitting elements 30 on a mounting board. This reduces manufacturing steps and manufacturing cost.

(3) Furthermore, the light emitting elements 30 formed on the ceramic substrate 20 are used by the light emitting device 10 and not removed. This allows for dense arrangement of the multiple light emitting elements 30 on the ceramic substrate 20. For example, the light emitting elements 30 are arranged on the ceramic substrate 20 at a higher density than when the light emitting elements 30 are mounted through wire-bonding on a mounting board other than the ceramic substrate 20. In this manner, the entire light emitting device 10 may be reduced in size.

(4) The buffer layer 34 is located between the upper surface 20A of the ceramic substrate 20 and the lower semiconductor layer 31. Thus, even when a lattice mismatch occurs between the ceramic substrate 20 and the lower semiconductor layer 31, the buffer layer 34 reduces the lattice mismatch. This allows the light emitting elements 30 to be formed on the upper surface 20A of the ceramic substrate 20 even when a lattice mismatch occurs between the ceramic substrate 20 and the lower semiconductor layer 31.

(5) The ceramic substrate 20 is an alumina substrate including alumina as the main component. Further, polycrystalline bodies are used as alumina. The light emitting elements 30 are electrically connected to one another by the wirings 40 arranged inside the ceramic substrate 20. In the present embodiment, the light emitting elements 30 are connected in parallel by the wirings 40. Thus, the wirings 40 connecting the light emitting elements 30 may be arranged inside the ceramic substrate 20, which is the base material. In this manner, the entire light emitting device 10 may be reduced in size compared with when the wiring electrically connecting the light emitting elements 30 is arranged outside the ceramic substrate 20, for example, on the upper surface of the insulation film 37. Also, the insulation film 37 does not have to include an opening or the like for wiring. This allows the light emitting elements 30 to be arranged on the ceramic substrate 20 at a high density.

(6) When polycrystalline bodies are used as alumina, the wirings 40 may be formed in the ceramic substrate 20 having a complex structure by a process using green sheets or the like.

(7) The lower surface of the electrode 35 of the light emitting element 30 is directly connected to the upper surface of the wiring layer 61 of the wiring 40. Further, the lower surface of the electrode 36 of the light emitting element 30 is directly connected to the upper surface of the wiring layer 51 of the wiring 40. This minimizes the connecting distance of the electrode 35 and the wiring layer 61 and the connecting distance of the electrode 36 and the wiring layer 51.

It should be apparent to those skilled in the art that the foregoing embodiment may be implemented in many other specific forms without departing from the scope of this disclosure. Particularly, it should be understood that the foregoing embodiment may be implemented in the following forms.

The above embodiment and the following modifications may be combined as long as the combined modifications remain technically consistent with each other.

In the above embodiment, the light emitting elements 30 are electrically connected to one another by the wirings 40 arranged inside the ceramic substrate 20. However, there is no limit to such a structure.

Figure 5:
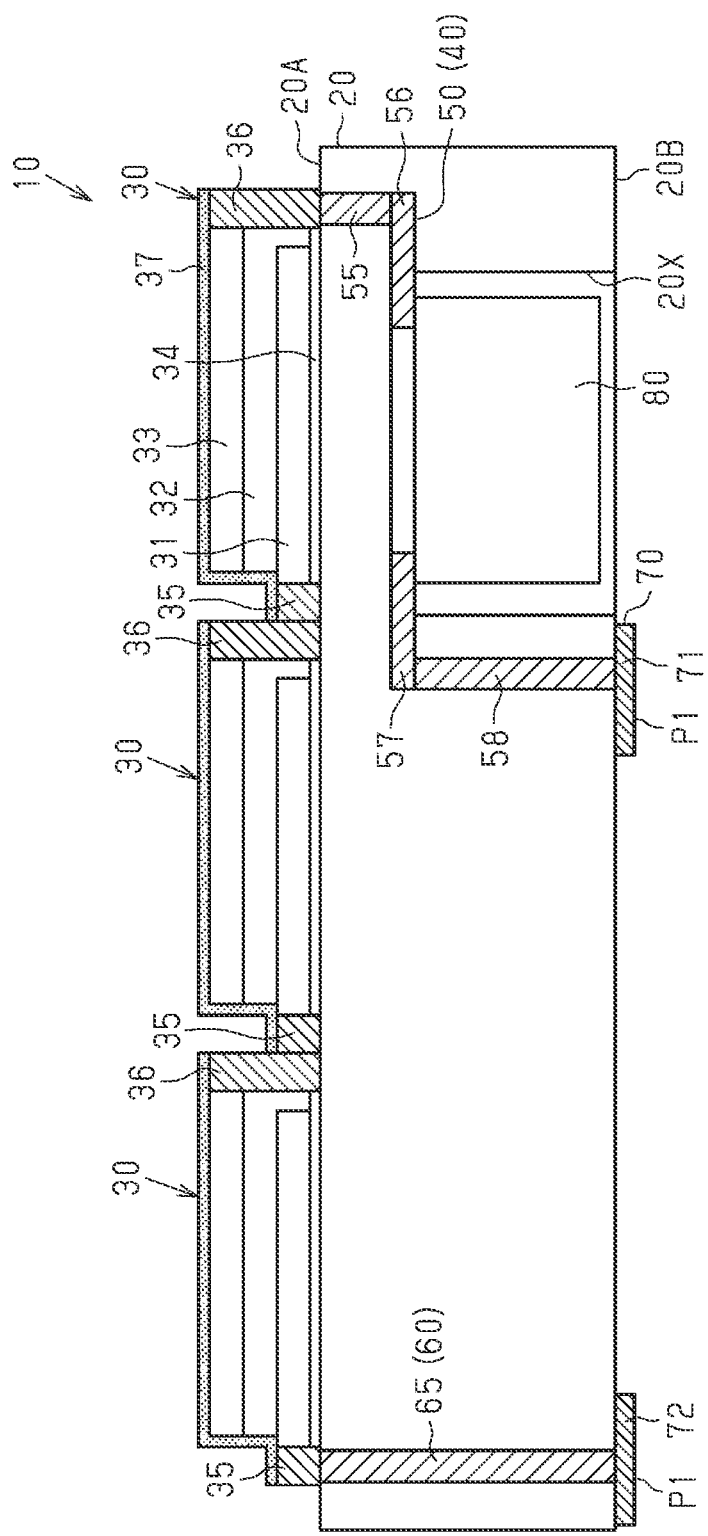
FIG. 5 is a schematic cross-sectional view illustrating a light emitting device of a modified example.

For example, as illustrated in FIG. 5, the electrodes 35 and 36 of the adjacent light emitting elements 30 may be directly connected. In the example illustrated in FIG. 5, the electrode 35 of the middle light emitting element 30 is directly connected to the electrode 36 of the left light emitting element 30. Also, the electrode 36 of the middle light emitting element 30 is directly connected to the electrode 35 of the right light emitting element 30. Thus, the three light emitting elements 30 are connected in series. In this case, the wiring 40 arranged inside the ceramic substrate 20 electrically connects, for example, the electrodes 35 and 36 and the electrode terminal 70. For example, the wiring 50 is connected to the electrode 36 of the right light emitting element 30 in FIG. 5. For example, the wiring 60 is connected to the electrode 35 of the light emitting element 30 in FIG. 5. The wiring 60 in the present example is a through-electrode 65 that extends through the ceramic substrate 20 in the thickness-wise direction. The upper surface of the through-electrode 65 is exposed from the upper surface 20A of the ceramic substrate 20 and directly connected to the lower surface of the electrode 35. The lower surface of the through-electrode 65 is exposed from the lower surface 20B of the ceramic substrate 20 and directly connected to the electrode terminal 72.

This structure allows adjacent light emitting elements 30 to be arranged close to one other on the ceramic substrate 20. Accordingly, the light emitting elements 30 may be arranged on the ceramic substrate 20 at a high density.

The electrodes 35 of adjacent light emitting elements 30 may be directly connected to each other. Alternatively, the electrodes 36 of the light emitting elements 30 may be directly connected to each other.

For example, as illustrated in FIG. 5, an electronic component 80 may be mounted inside the ceramic substrate 20. The ceramic substrate 20 in the present example includes a recess 20X that is recessed from the lower surface 20B of the ceramic substrate 20 toward the upper surface 20A of the ceramic substrate 20. The electronic component 80 is accommodated in the recess 20X. In this case, the wiring 50 includes, for example, a wiring layer 55, a wiring layer 56, a wiring layer 57, and a wiring layer 58. The wiring layer 55 is directly connected to the electrode 36 of the right light emitting element 30 in FIG. 5. The wiring layer 56 is formed on the bottom surface of the recess 20X and connected to the wiring layer 55. The wiring layer 57 is formed on the bottom surface of the recess 20X. The wiring layer 58 is connected to the wiring layer 57.

The upper surface of the wiring layer 55 is exposed from the upper surface 20A of the ceramic substrate 20. The upper surface of the wiring layer 55 is directly connected to the lower surface of the electrode 36. The lower surface of the wiring layer 55 is connected to the upper surface of the wiring layer 56. The wiring layer 55 is post-shaped and extends downward from the upper surface 20A of the ceramic substrate 20.

The wiring layer 56 extends in the planar direction of the ceramic substrate 20. Part of the wiring layer 56 is, for example, formed on the bottom surface of the recess 20X. The portion of the wiring layer 56 formed on the bottom surface of the recess 20X is exposed from the ceramic substrate 20. That is, the wiring layer 56 is partially exposed at the bottom of the recess 20X.

The wiring layer 57 is separated from the wiring layer 56. The wiring layer 57 extends in the planar direction of the ceramic substrate 20. Part of the wiring layer 57 is, for example, formed on the bottom surface of the recess 20X. The portion of the wiring layer 57 formed on the bottom surface of the recess 20X is exposed from the ceramic substrate 20. That is, the wiring layer 57 is partially exposed at the bottom of the recess 20X.

The upper surface of the wiring layer 58 is connected to the lower surface of the wiring layer 57. The lower surface of the wiring layer 58 is connected to the upper surface of the electrode terminal 71. The wiring layer 58 is post-like and extends downward from the lower surface of the wiring layer 57. The lower surface of the wiring layer 58 is exposed from the lower surface 20B of the ceramic substrate 20. The lower surface of the wiring layer 58 is directly connected to the upper surface of the electrode terminal 71.

The electronic component 80 is mounted on, for example, the wiring layers 56 and 57 that are exposed at the bottom of the recess 20X. The electronic component 80 is electrically connected to the wiring layers 56 and 57. The electronic component 80 may be mounted through, for example, flip-chip mounting, wire-bonding, solder mounting, or a combination these processes.

The electronic component 80 may be, for example, an active component such as a semiconductor chip, a transistor, and a diode or a passive component such as a chip capacitor, a chip inductor, and a chip resistor.

This structure allows the electronic component 80 to be arranged at a position overlapping the light emitting element 30 in a plan view. This avoids enlargement of the light emitting device 10 in the planar direction.

The electronic component 80 may be mounted inside the ceramic substrate 20 illustrated in FIG. 1. In other words, the electronic component 80 may be mounted inside the ceramic substrate 20 even in a structure in which the light emitting elements 30 are electrically connected to one another by the wirings 40 arranged inside the ceramic substrate 20.

In the modified example illustrated in FIG. 5, the wiring layers 56 and 57 are formed on the bottom surface of the recess 20X. In the example illustrated in FIG. 5, the side surfaces of the wiring layers 56 and 57 are exposed from the ceramic substrate 20 in the recess 20X. Instead, the side surfaces of the wiring layers 56 and 57 may be covered by the ceramic substrate 20. In this case, for example, the lower surfaces of the wiring layers 56 and 57 are formed to be flush with the bottom surface of the recess 20X. Further, in this case, for example, only the lower surfaces of the wiring layers 56 and 57 are exposed at the bottom of the recess 20X.

In the modified example illustrated in FIG. 5, a lower part of the electronic component 80 may be projected downward from the lower surface 20B of the ceramic substrate 20.

In the modified example illustrated in FIG. 5, multiple electronic components 80 may be mounted inside the ceramic substrate 20. In this case, for example, a plurality of electronic components 80 may be accommodated in the same recess 20X. Further, for example, the ceramic substrate 20 may include multiple recesses 20X, each accommodating an electronic component 80.

The electronic component 80 mounted inside the ceramic substrate 20 does not have to be of a single type, and multiple types of the electronic components 80 may be mounted inside the ceramic substrate 20. For example, the electronic component 80 that is an active component such as a semiconductor chip and the electronic component 80 that is a passive component such as a chip capacitor may be mounted inside the ceramic substrate 20.

Figure 6:
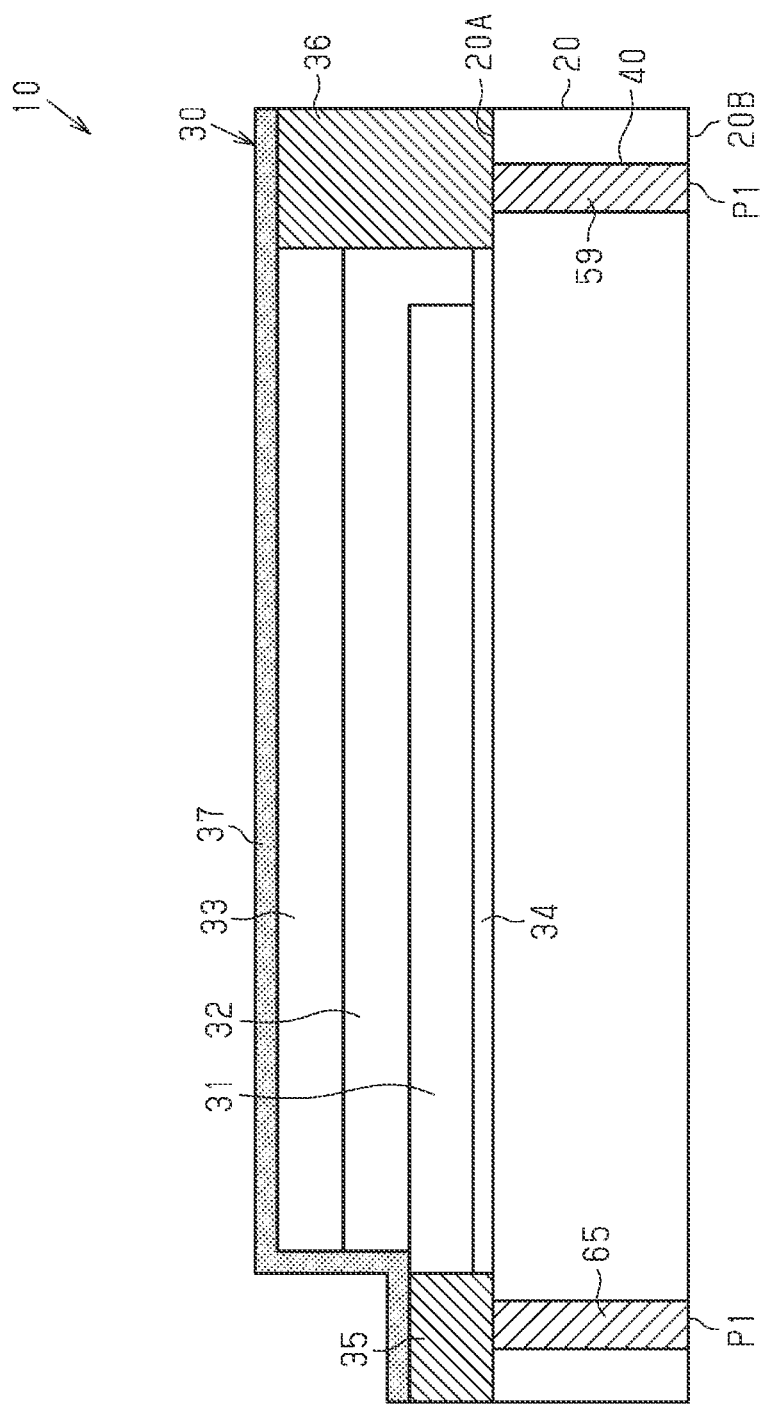
FIG. 6 is a schematic cross-sectional view illustrating a light emitting device of a further modified example.

In the above embodiment, multiple light emitting elements 30 are formed on the upper surface 20A of the ceramic substrate 20. However, there is no limit to such a structure. For example, as illustrated in FIG. 6, a single light emitting element 30 may be formed on the upper surface 20A of the ceramic substrate 20. In this case, the wiring 40 electrically connected to the light emitting element 30 is also formed inside the ceramic substrate 20. The wiring 40 includes, for example, the through-electrode 65 and a through-electrode 59. The through-electrode 65 is electrically connected to the lower semiconductor layer 31 via the electrode 35. The through-electrode 59 is electrically connected to the upper semiconductor layer 33 via the electrode 36. The through-electrodes 59 and 65 extend through the ceramic substrate 20 in the thickness-wise direction. The upper surfaces of the through-electrodes 59 and 65 are exposed from the upper surface 20A of the ceramic substrate 20. The upper surfaces of the through-electrodes 59 and 65 are flush with the upper surface 20A of the ceramic substrate 20. The upper surface of the through-electrode 59 is, for example, directly connected to the lower surface of the electrode 36. The upper surface of the through-electrode 65 is, for example, directly connected to the lower surface of the electrode 35. The lower surfaces of the through-electrodes 59 and 65 are exposed from the lower surface 20B of the ceramic substrate 20. The lower surfaces of the through-electrodes 59 and 65 are flush with the lower surface 20B of the ceramic substrate 20.

In this modified example, the ceramic substrate 20 may be embodied in a sapphire substrate formed from a monocrystalline alumina (sapphire).

With reference to FIG. 6, the electrode terminal 70 may be omitted. In the modified example of FIG. 6, the lower surfaces of the through-electrodes 59 and 65 function as the external connection pads P1. For example, external connection terminals (not illustrated) are directly connected to the lower surfaces of the through-electrodes 59 and 65. In this case, the light emitting element 30 is supplied with power from an external power supply (not illustrated) via the external connection terminals, the through-electrodes 59 and 65, and the like to emit light.

The electrode terminal 70 may also be omitted from the above embodiment or the modified example illustrated in FIG. 5.

In the above embodiment, the metal layer 70A, which forms the electrode terminal 70, is formed on the lower surface of the green sheet 23 before the green sheets 21 to 23 are fired. Instead, for example, the electrode terminal 70 may be formed on the lower surface 20B of the ceramic substrate 20 after firing the green sheets 21 to 23 to form the ceramic substrate 20. In this case, the electrode terminal 70 may be formed, for example, in the same manner as the electrodes 35 and 36.

The structure of the light emitting element 30 in the above embodiment is not limited. For example, the buffer layer 34 of the light emitting element 30 may be omitted. For example, the insulation film 37 may cover the side surfaces of the electrodes 35 and 36. Further, for example, the insulation film 37 may cover the upper surface 20A of the ceramic substrate 20 that is exposed from the light emitting element 30.

In the above embodiment, the ceramic substrate 20 is embodied in a ceramic substrate that has a wavelength conversion functionality. However, there is no limit to such a structure. For example, the ceramic substrate 20 may be embodied in a ceramic substrate that does not have a wavelength conversion functionality. In this case, the upper surface 20A, the lower surface 20B, or the like of the ceramic substrate 20 may include a fluorescence substance film that has a wavelength conversion functionality.

The wiring 40 in the above embodiment may have any structure. For example, the number of layers in the wiring 40 or the layout of the wiring 40 may be changed in any manner.

All examples and conditional language recited herein are intended for pedagogical purposes to aid the reader in understanding the principles of the invention and the concepts contributed by the inventors to furthering the art, and are to be construed as being without limitation to such specifically recited examples and conditions, nor does the organization of such examples in the specification relate to an illustration of the superiority and inferiority of the invention. Although embodiment has been described in detail, it should be understood that various changes, substitutions, and alterations could be made hereto without departing from the scope of this disclosure.

What is claimed is:
1. A light-emitting device, comprising:
a ceramic substrate;
a light-emitting element formed on an upper surface of the ceramic substrate; and a wiring arranged inside the ceramic substrate and electrically and directly connected to the light-emitting element, wherein the light-emitting element includes a structure in which a lower semiconductor layer, an active layer, and an upper semiconductor layer are sequentially stacked;

the light-emitting element is one of a plurality of light-emitting elements formed on the upper surface of the ceramic substrate;

the plurality of light-emitting elements are electrically and directly connected to the wiring;

each of the plurality of light-emitting elements includes:
  a first electrode formed on the upper surface of the ceramic substrate and connected to the lower semiconductor layer, and
  a second electrode formed on the upper surface of the ceramic substrate and connected to the upper semiconductor layer;

the first electrode and the second electrode are electrically and directly connected to the wiring, and the first electrode of one of two adjacent ones of the plurality of light-emitting elements is connected to the first electrode or the second electrode of the other one of the two adjacent ones of the plurality of light-emitting elements.

2. The light-emitting device according to claim 1, wherein the light-emitting element includes a buffer layer formed on the upper surface of the ceramic substrate, and the lower semiconductor layer is formed on an upper surface of the buffer layer.

3. The light-emitting device according to claim 1, wherein the ceramic substrate is an alumina substrate including alumina as a main component, the alumina is a polycrystalline body, and the wiring electrically connects the plurality of light-emitting elements to one another.

4. The light-emitting device according to claim 1, wherein the ceramic substrate is a sapphire substrate, and the wiring includes a through-electrode extending through the ceramic substrate in a thickness-wise direction.

5. The light-emitting device according to claim 1, wherein the wiring includes
  a first wiring layer electrically connected to the first electrode, and
  a second wiring layer electrically connected to the second electrode, a lower surface of the first electrode is directly connected to an upper surface of the first wiring layer that is exposed from the upper surface of the ceramic substrate, and a lower surface of the second electrode is directly connected to an upper surface of the second wiring layer that is exposed from the upper surface of the ceramic substrate.

6. The light-emitting device according to claim 1, further comprising an electrode terminal formed on a lower surface of the ceramic substrate and electrically and directly connected to the wiring.

7. The light-emitting device according to claim 1, wherein the ceramic substrate includes a recess that is recessed from a lower surface of the ceramic substrate toward the upper surface of the ceramic substrate, the wiring includes a wiring layer exposed at a bottom of the recess, and the light-emitting device further comprises an electronic component mounted on the wiring layer.

* * * * *